US007196907B2

(12) United States Patent
Zheng

(10) Patent No.: US 7,196,907 B2
(45) Date of Patent: Mar. 27, 2007

(54) ELASTO-PLASTIC SOCKETS FOR LAND OR BALL GRID ARRAY PACKAGES AND SUBSYSTEM ASSEMBLY

(76) Inventor: Wen-Chun Zheng, 551 Crystalberry Ter., San Jose, CA (US) 95129

( * ) Notice: Subject to any disclaimer, the term of this patent is extended or adjusted under 35 U.S.C. 154(b) by 339 days.

(21) Appl. No.: 10/775,590

(22) Filed: Feb. 9, 2004

(65) Prior Publication Data

US 2005/0174744 A1 Aug. 11, 2005

(51) Int. Cl.
*H05K 7/00* (2006.01)

(52) U.S. Cl. ...................... 361/760; 361/777; 361/807; 361/810; 439/66; 439/73

(58) Field of Classification Search ................ 361/760, 361/777, 720, 810, 704, 807; 439/73, 66, 439/515
See application file for complete search history.

(56) References Cited

U.S. PATENT DOCUMENTS 4,161,346 A * 7/1979 Cherian et al. ............... 439/66
5,380,210 A * 1/1995 Grabbe et al. ................ 439/66
5,919,050 A * 7/1999 Kehley et al. ................ 439/71
5,984,693 A * 11/1999 McHugh et al. .............. 439/66
6,149,443 A * 11/2000 Moran ......................... 439/66
6,171,128 B1 * 1/2001 Huang et al. ............... 439/342
6,183,269 B1 * 2/2001 Sarkissian et al. ......... 439/76.1
6,449,155 B1 9/2002 Colbert et al. .............. 361/704
6,475,011 B1 11/2002 Sinha et al. ................ 439/330
6,485,320 B1 11/2002 Ma ........................... 439/342
6,545,879 B1 * 4/2003 Goodwin .................... 361/807
6,626,683 B2 9/2003 Lai ............................ 439/73
6,672,881 B2 * 1/2004 Evans ......................... 439/71
6,765,793 B2 * 7/2004 Kehret et al. ............... 361/690
6,930,884 B2 * 8/2005 Cromwell et al. .......... 361/710
6,974,331 B2 * 12/2005 Brown et al. ................. 439/66
6,976,888 B2 * 12/2005 Shirai et al. ................ 439/862

* cited by examiner

*Primary Examiner*—Tuan Dinh
*Assistant Examiner*—Hung S. Bui
(74) *Attorney, Agent, or Firm*—Patent Law Group LLP; David C. Hsia

(57) ABSTRACT

An elasto-plastic socket for Land or Ball Grid Array package comprising a plurality of metal contacts embedded in a substrate by lamination. The curved plate spring of the metal contacts enable large deformation to accommodate all tolerances other than package tolerance and ensure uniform contact pressure across the package because they are designed based on the application of elasto-plasticity theory. An elasto-plastic stiffener shares the pressure from heat sink to package substrate and semiconductor. A cutting edge subsystem assembly for Land or Ball Grid Array package integrates L/BGA socket, L/BGA package and heat sink with a frame on top of PCB to increase the stiffness. The methods of post manufacturing including post forming and post age hardening used for testing socket application can increase the durability.

17 Claims, 7 Drawing Sheets

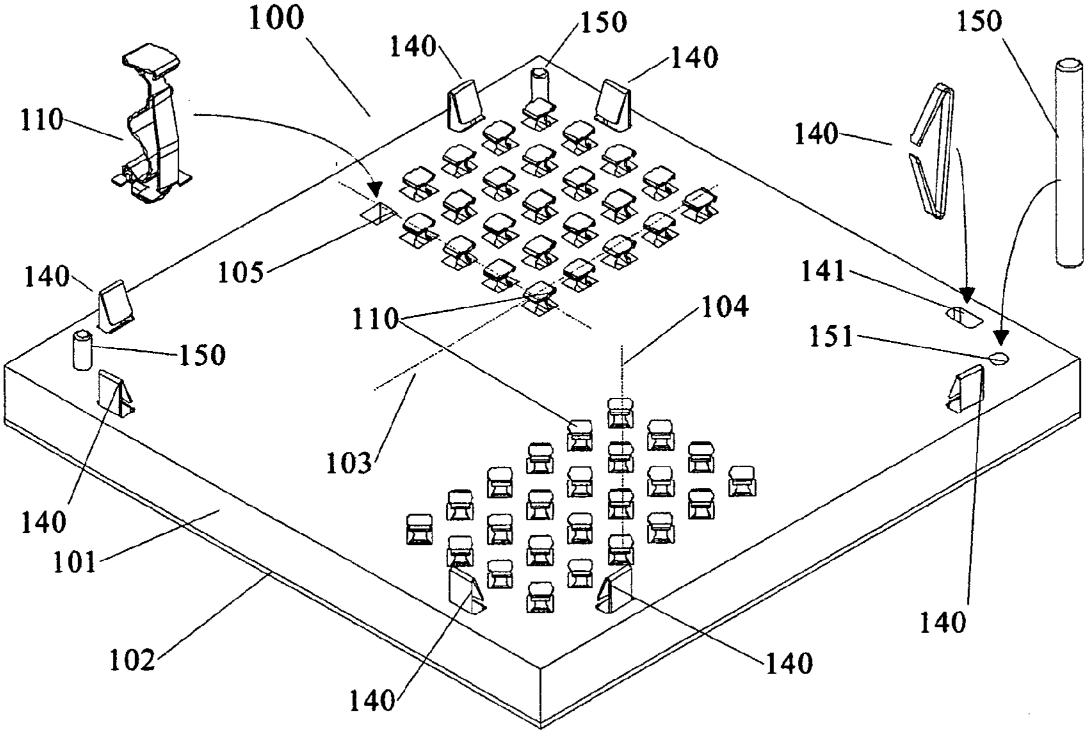
FIG. 1
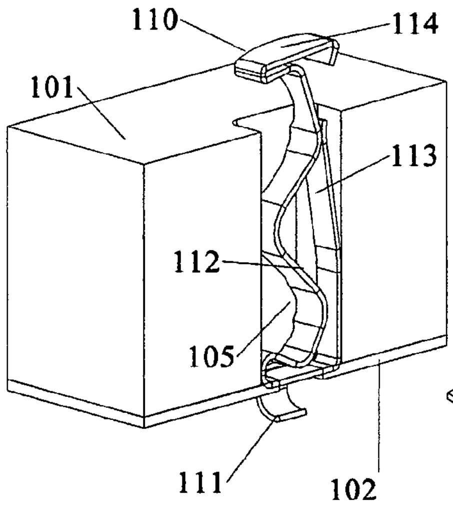
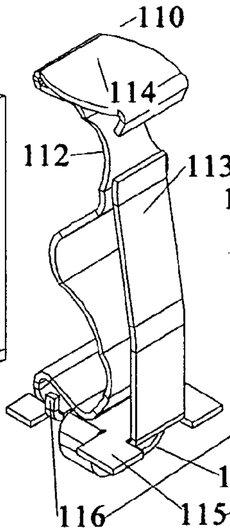
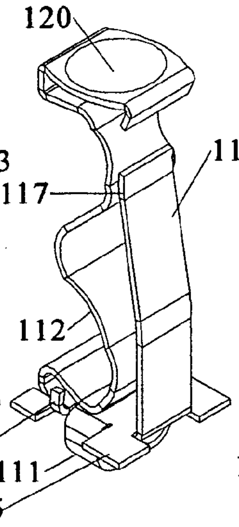
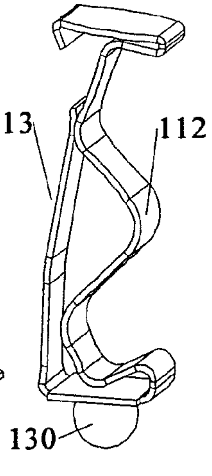
FIG. 2 FIG. 3A FIG. 3B FIG. 3C

ELASTO-PLASTIC SOCKETS FOR LAND OR BALL GRID ARRAY PACKAGES AND SUBSYSTEM ASSEMBLY

BACKGROUND OF THE INVENTION

The field of the invention is related to the applications of electronics interconnect with Land or Ball Grid Array (L/BGA) socket and the subsystem assembly.

Land or Ball Grid Array sockets have been used to interconnect high pin count integrated circuits (IC) packages for many years. There are varieties of these sockets available in applications. The terminals of stamped metal are one of the types widely used for these sockets in previous inventions.

As the nanotechnology advances in semiconductor processing, very low K dielectric materials with very low mechanical strength are being used in IC semiconductors to dramatically enhance the electrical performances. The pin count, package size and power of IC packages increase as the IC density increases. Therefore, the requirements for L/BGA socket interconnect become more challenging. The essential requirements for L/BGA socket interconnect are the capability of large travel in Z direction to accommodate the tolerances contributed by the printed circuit board (PCB), package co-planarity and other fixtures, the short electrical path for better electrical performance, and low pressure transferred to semiconductor due to the restriction of low mechanical strength of the dielectric materials used in IC semiconductor.

To solve the mechanical and thermal problems for high pin count and high powered L/BGA electronics packages, the subsystem assembly with L/BGA sockets is very critical. The bolster plate of bow shape is used in the conventional set-up for LGA socket so that the pressure over the LGA socket can be more evenly distributed. An alternative approach to the same propose was invented for LGA multichip modules by IBM (U.S. Pat. Nos. 6,449,155 and 6,475,011) such that the contact force applied to the center of the socket through PCB by a screw at the center from bottom side. To make LGA subassembly simpler, a fixture with a lever was developed for LGA subsystem assembly in the invention (U.S. Pat. No. 6,485,320). In order to share the contact pressure from semiconductor to the package substrate, or to make the subassembly for lidless flip chip package for better heat dissipation, some designs of a cover used on top of the package substrate were innovated, for examples, U.S. Pat. No. 6,545,879 and U.S. Pat. No. 6,626,683. However, the concept is seldom used in application because the tolerances of all components are difficult to control as well as the amount of the force.

BRIEF SUMMARY OF THE INVENTION

According to the brief discussion on the current technology of L/BGA interconnect, the primary object of the present invention is to provide the elasto-plastic Land or Ball Grid Array sockets which enable large travel in Z-direction composed of elastic and plastic deformation so that the tolerances of all components except package can be accommodated. Based on Elasto-Plasticity theory, every terminal supports the same level of contact force so as to have nearly uniformed contact force or pressure over the whole socket, since all terminals have loaded to plastic hardening stage after the first loading or post-forming process. The metal terminals of the elasto-plastic sockets are stamped and formed into plate-spring with a sliding contact wall which shortens the electrical path.

Another object of the present invention is to provide an elasto-plastic stiffener which is made of sheet metal to be used between heat sink and package substrate to quantitatively share the contact force due to the clamping mechanism from the semiconductor. This application of Elasto-Plasticity theory enables large compressive deformation with bounded force so that the stiffener can accommodate the tolerances with the designed mechanical strength.

The third object of the present invention is to provide the method of subsystem assembly with L/BGA socket. The key part is the frame on top of PCB to increase the stiffness of the structure so that the flatness of L/BGA socket can be maintained better for electrical connection. This structure of the subsystem integration eliminates the use of traditional spring-screws and simplifies the assembly process.

In order to have higher fatigue life for testing sockets, the other object of the present invention is to provide a means of post manufacturing composed of post-forming and post age hardening technology. The post forming process finalizes the shape of metal contact on board after assembly so that all tolerances of all components except package are absorbed in the final shape. The post age hardening process increases the elasticity range of the terminals so that the fatigue life can be increased because the terminals of the socket will work in linear elasticity in the lifetime.

Other aspects and advantages of the present invention will be given in detail from the following description and claims.

BRIEF DESCRIPTION OF THE DRAWINGS

FIG. 1 is a perspective view of the first main embodiment of the elasto-plastic socket for Land Grid Array (LGA) package. It shows the possible orientations and layouts of the stamped metal contacts on the carrier.

FIG. 2 is an inside perspective view of the structure for one metal contact.

FIG. 3(*a*) is a perspective view of the stamped metal contact for LGA packages; FIG. 3(*b*) is a perspective view of the stamped metal contact for Ball Grid Array (BGA) packages; FIG. 3(*c*) is a perspective view of the stamped metal contact attached with solder ball for Ball Grid Array (BGA) interface with PCB.

FIG. 8(*b*) is a graph illustrating the responding curves of pressure or force versus displacement of the elasto-plastic components, with respect to the conditions shown in FIG. 8(*a*).

DETAILED DESCRIPTION OF THE INVENTION

Figure 4:
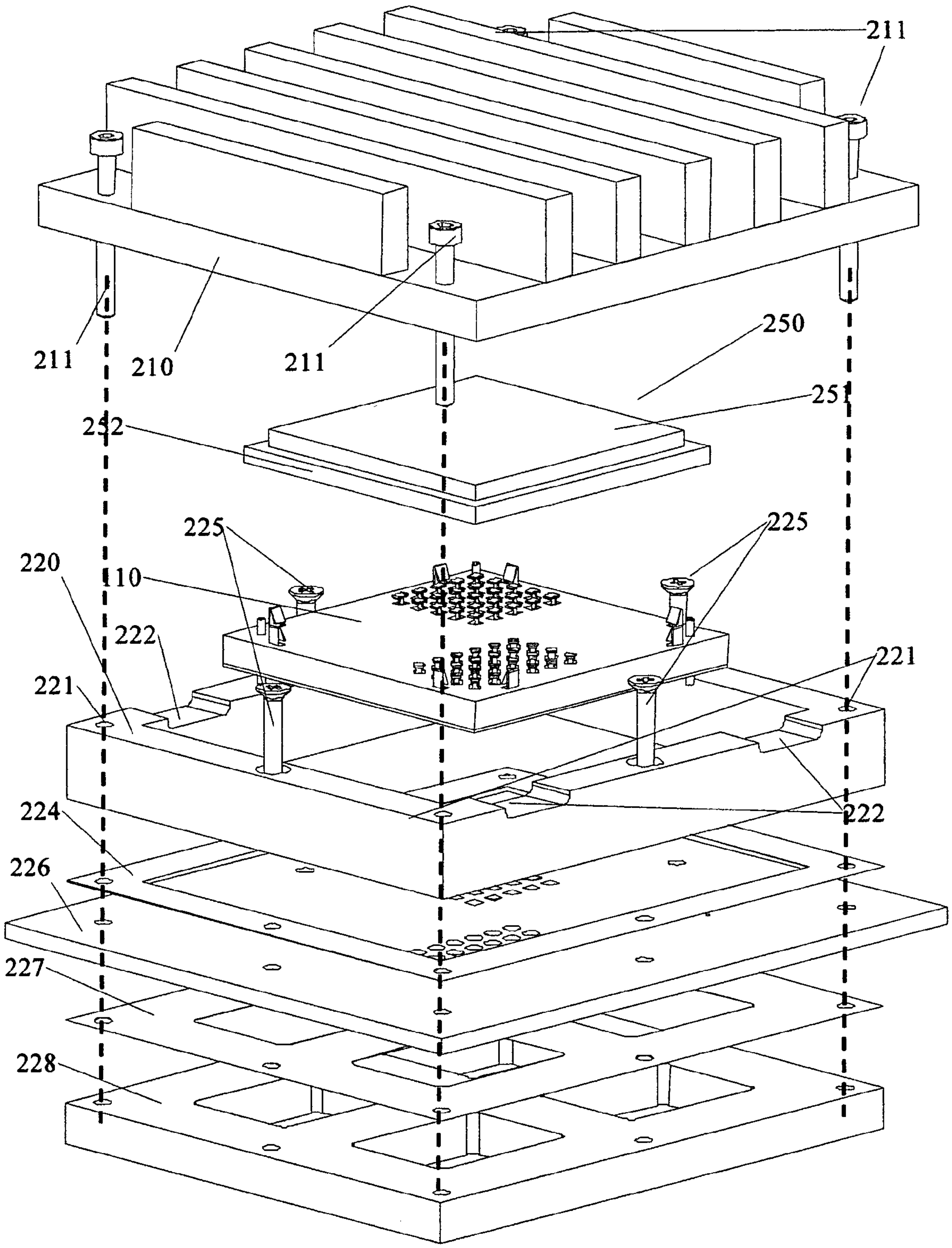
FIG. 4 is an exploded perspective view of the second main embodiment of the subsystem assembly for a lidded flip chip package.

Detailed descriptions of the main embodiments are provided herein. It is to be understood, however, that the present invention may be embodied in various forms. Therefore, specific details disclosed herein are not to be interpreted as limiting, but rather as a basis for the claims and as a representative basis for teaching one skilled in the art to employ the present invention in virtually any appropriately detailed system, structure or process.

Turning first to FIG. 1, which shows the first main embodiment of the elasto-plastic socket, Land Grid Array (LGA) socket 100 is used as an example throughout this disclosure. A printed circuit board (PCB) laminate or molded plate 101 is used as the carrier on which the layout matrix of the contact housing 105 of rectangular with round corners are formed with various approaches such as laser, mechanical machining, molding tool or chemical processing. It shows the possible layout orientations such as parallel 103 to the edge or diagonal 104 directions. The spring clips 140 are push-fit in the holes 141 to be used for in-plane alignment of package lands or balls to the stamped metal contact surfaces. Another alternative for alignment is to use pins 150 pressed fit in the holes 151, and the holes on package or PCB side. The use of alignment pins is a better approach because of the better control on tolerance. The detailed structure is further illustrated in FIG. 2. It is easy to understand the processing of making the same. The metal contacts 110 are push-fit into the housing on the laminate or plate, and then they are fixed in the positions using either a PCB (e.g., FR4 or BT) prepreg 102 with laser drilled holes or a PCB substrate with the holes and a bonding thin film by a standard PCB lamination process.

FIG. 3(*a*) shows the perspective view of a LGA metal contact 10 which is made by stamping and forming a sheet metal strips. The contact comprises of the LGA contact surface 114, the plate spring 112 of variable width optimized for maximum deflection of the contact surface 114 and for minimum stress and stiffness for the spring, the contact wall 113 for short electrical path with the friction contact 117, the PCB interface contact 111, the bonded portion 115 and the push-fit features 116. The PCB interface contact 111 is preferred to using surface mount on the PCB with solder joint but it is also workable with direct contact with the metal pad on board by the clamping force. For better electrical performance, the metal contact is stamped from strips of copper alloys, e.g., Beryllium Copper (BeCu), etc. with gold plating. In accordance with the feature of LGA metal contact 110, the top contact surface 114 is formed into a concave spherical surface 120 as shown in FIG. 3(*b*). This metal contact is used to build a BGA socket for better contact with solder ball on BGA package. FIG. 3(*c*) shows an alternative to the PCB interface contact 111 that a solder ball 130 is attached to bottom side of the metal contact. The processing of making it is slightly different from the case of FIG. 3(*a*). After the lamination with FR4 prepreg, the solder pad opening can be burned by laser beam. It is then completed with standard solder ball attachment processing. This option of solder ball on PCB side makes the stamping processing simpler.

The advantages of the metal contact are that the curved plate spring 112 allows larger travel for the top surface 114 and the contact wall 113 in FIG. 2 provide shorter electrical path for better electrical performance. Because of the superior advantages, the subsystem assembly can be much simpler than any prior art, as shown in FIG. 4. The LGA socket 110 is surface mounted on the PCB 226 by solder joint. The insulator sheet 227 is applied between the bolster plate 228 and PCB 226. The frame 220 of the second main embodiment is new concept for LGA interconnect applications. It is made of high stiffness materials such as stainless steel. The insulator 224 between frame 220 and PCB 226 is optional. The screws 225 are used to sandwich frame 220, insulator film 224, PCB 226, insulator film 227 and the bolster plate 228. The lidded LGA package 250 is aligned to the LGA socket, and the heat sink 210 is finally fixed on top of the frame 220 with the screws 211 which tied at the bolster plate along the dashed lines. It is obvious that the top of the package lid 251 contacts tightly with the bottom of the heat sink 210 because the package 210 is supported by the metal contacts 110 in FIG. 3(*a*). It is understood that thermal interface materials such as thermal grease/gel are used at the interface of package lid 251 and the base of heat sink 210. To understand better, the lidded LGA package sitting on the LGA socket 110 is caged in the cavity of frame 220, socket 110 and the base of heat sink. The opening gaps 222 on the frame 220 are used for inspection of the contact interface of package and heat sink base. The screws 225 bonding frame 220 to bolster plate 228 are used to increase the bending stiffness of the bottom side of the package. The positions and numbers of the open gaps 222 and the screws 225 can have any combinations. This approach utilizes all possible spacing in the subsystem integration, and eliminates the use of expensive spring-screws used in prior art for LGA interconnect. Since the metal contacts allow large displacement of both elastic and plastic deformations, which will be further explained later, this subsystem integration can accommodate all of the Z-tolerances caused by all components such as PCB thickness and socket, by processing such as solder joint. The tolerance of package thickness and flatness can be easily accommodated by the elastic deformation of the metal contacts after first time loading.

Figure 5:
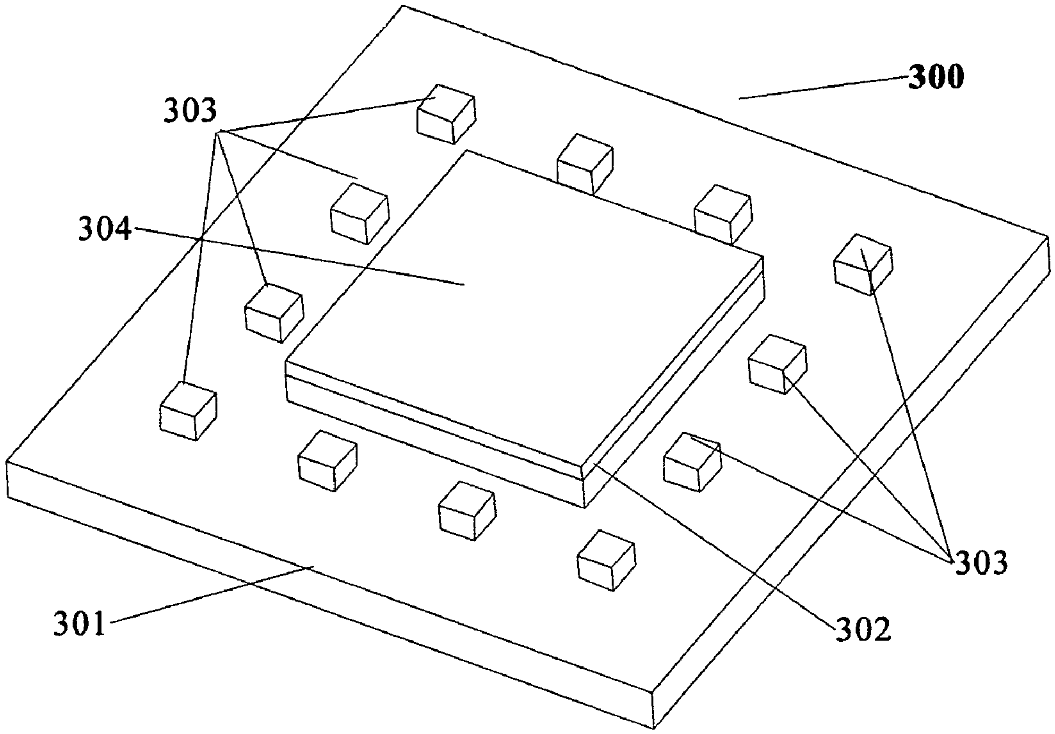
FIG. 5 is a perspective view of the flip-chip package with heat spreader taped on top of the semiconductor.

Turning to FIG. 5, a very thin heat spreader 304 of very high in-plane or isotropic thermal conductivity, for example, Carbon-Carbon composite, is taped or attached on top of the semiconductor chip 302 to distribute the hot spots in the junction layer of the semiconductor 302, which is surface mount on the package substrate 301. The capacitors 303 or other electronic components are mounted on the substrate 301 also. The application of taped heat spreader is illustrated by a single chip package 300, but it also applicable to a multi-chip model (MCM). This approach has significant advantages over lidded package such as lower cost, better reliability and heat dissipation, because the materials of lids or heat spreaders, which requires coefficient of thermal expansion (CTE) match with semiconductor and substrate, usually has lower thermal conductivity than the base of heat sink.

However, the pressure on semiconductor chip can not be controlled precisely for a lidless flip chip package with various solid stiffeners in privious art, or lidded flip chip LGA or BGA package 250, as pointed out in review section. The third main embodiment of the elasto-plastic stiffener 400 is therfore illustrated by FIGS. 6(*a*), (*b*) and (*c*). The stiffener 400, which is made from sheet metal with single piece or multiple pieces by stamping and forming, comprises the top side 403, the bottom side 404, the opening widows 402 for capacitors or other components, the clips 405 to the package substrate and the supporting columns of wave shape 401, or leaning shape 401'. It is clearly applicable to multi-chip modules also. The columns are the most important structure for this disclosure and may be any other forms that allow large deformation in the direction of stiffener thickness and support desired presure which combining with the pressure on semiconductor balances the contact force from bottom of heat sink. For example, the total force from bottom of heat sink is 500lb which is balanced with the total force of socket contacts, if the force on semiconductor allowed is 150lb, the total supporting force of the elasto-plastic stiffener will be 350lb. This principle of the design will ensure semiconductor chip to have tight contact with bottom of heat sink. Another form of the elasto-plastic stiffener of FIG. 6(*c*) is a sandwiched structure comprising of the supporting columns 413 located by the cliping features 415 on bottom 412 and top 414 plates. The opening windows 402 from bottom to top plates are required for other semiconductors or components, such as multi-chip modules.

Figure 7:
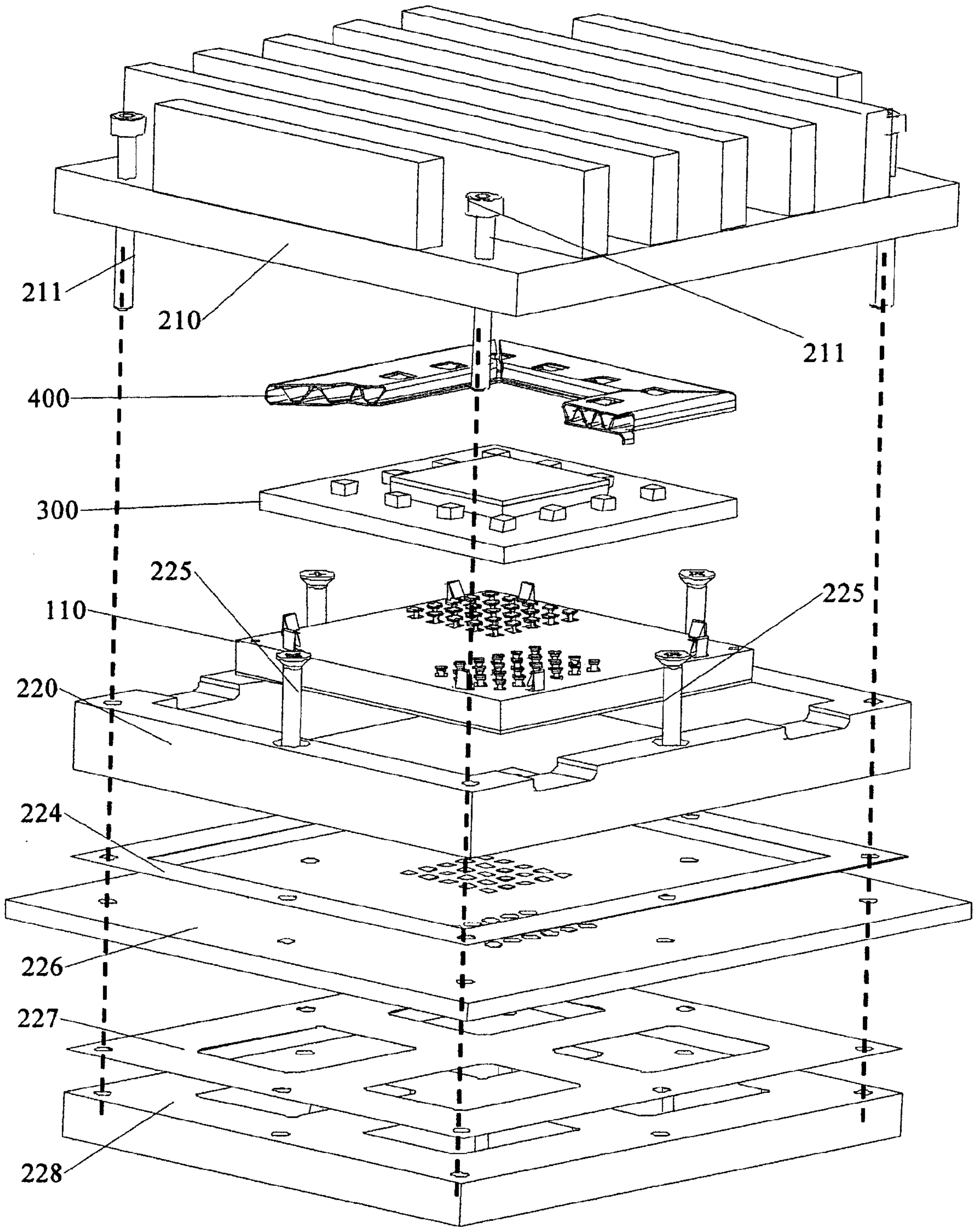
FIG. 7 is an exploded perspective view of the second main embodiment of the subsystem assembly with the elasto-plastic stiffener for a lidless flip chip package with heat spreader (shown in FIG. 5).

Turning now to the perspective view of the subsystem assembly in FIG. 7, the elasto-plastic stiffener 400 is applied on top of the flip chip LGA package 300 with a taped-on heat spreader. All other components are assembled the same way as in FIG. 4. The unique requirement is that the force applied to the stiffener 400 from the base of heat sink is less than the summation of the contact force of each stamped metal contact of the LGA socket, so that the difference of these two forces will be applied to the top of the semiconductor to ensure tight contact between the top of LGA package and the bottom of the heat sink for better heat dissipation. To make it perform as designed, the elasto-plasticity theory must be applied.

Figure 8A:
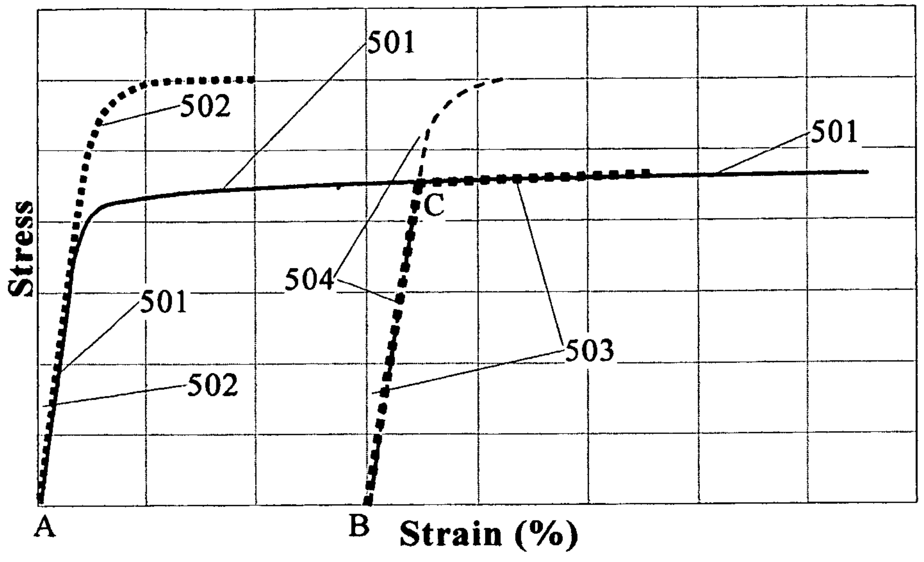
FIG. 8(*a*) is a graph depicting the typical stress-strain curves of some copper alloys, such as beryllium copper, under various conditions.
Figure 8B:
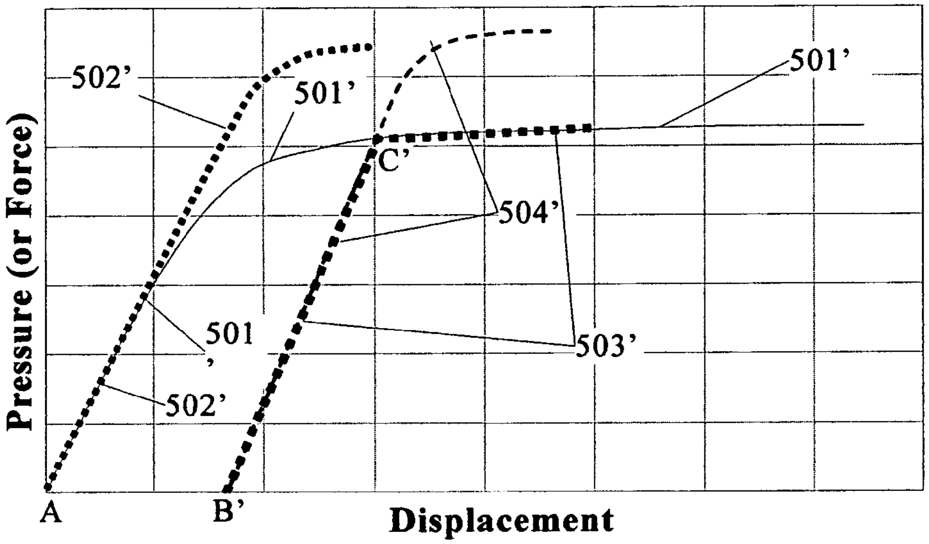
Figure 9:
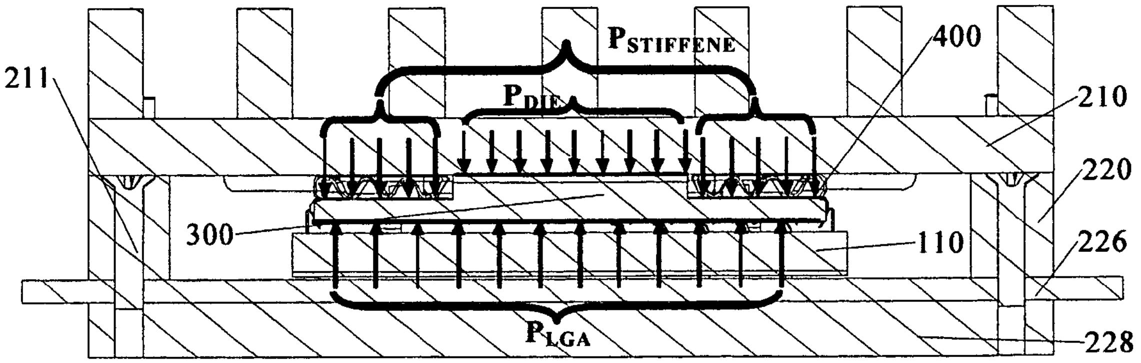
FIG. 9 illustrates the fourth main embodiment of the application of the Elasto-Plasticity theory with the cross section view of the subsystem assembly (as shown in FIG. 7) of a integrate circuits (IC) package, an elasto-plastic socket and an elasto-plastic stiffener.

To explain the application of the elasto-plasticity theory on the elasto-plastic LGA/BGA socket and the elasto-plastic stiffener, FIGS. 8(*a*) and (*b*), and FIG. 9 are utilized. The stress-strain curves of some copper alloys such as BeCu and etc. are drawn in FIG. 8(*a*). It is well known that metals exhibit different mechanical properties with different heat treatments such as temper or hardening processes. The curve 501 in FIG. 8(*a*) shows very good ductibility with high plastic strain after age and/or mill hardening tempers, say ¼H or ¼HM. The curve 502 in FIG. 8(*a*) shows much higher strength but much lower ductibility after higher temper process for the same materials. It is notable that the stiffness (Young's modulus) is unchanged with different temper processes. It is also well known that the unloading and reloading behaves as curve 503 when it comes to plastic hardening stage with plastic strain (between A and B). Generally, the metal contacts in connector applications need age hardening for higher mechanical strength after the metal terminals are formed. Thus the stress-strain relation behaves along the path of curve 501 to point C and then unloading to B for the forming process. After age hardening, the property of the stress-strain relation behaves like curve 504 in FIG. 8(*a*).

Figure 6A:
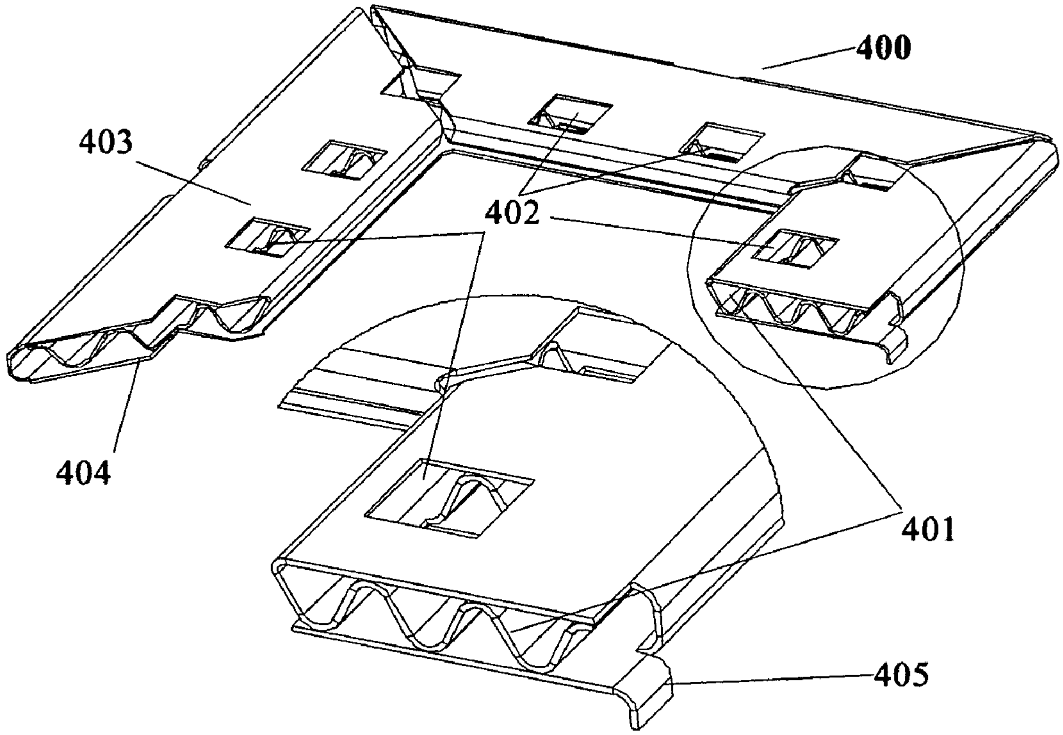
FIGS. 6(*a*), (*b*) and (*c*) are the perspective views of the third main embodiment of the elasto-plastic stiffeners made of one piece or multiple pieces of sheet metal.
Figure 6B:
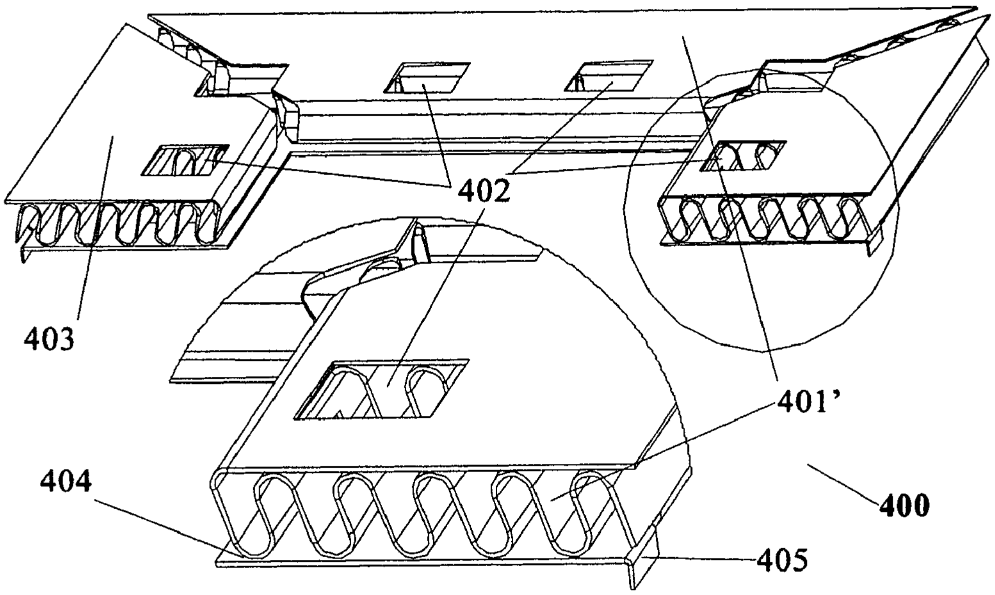
Figure 6C:
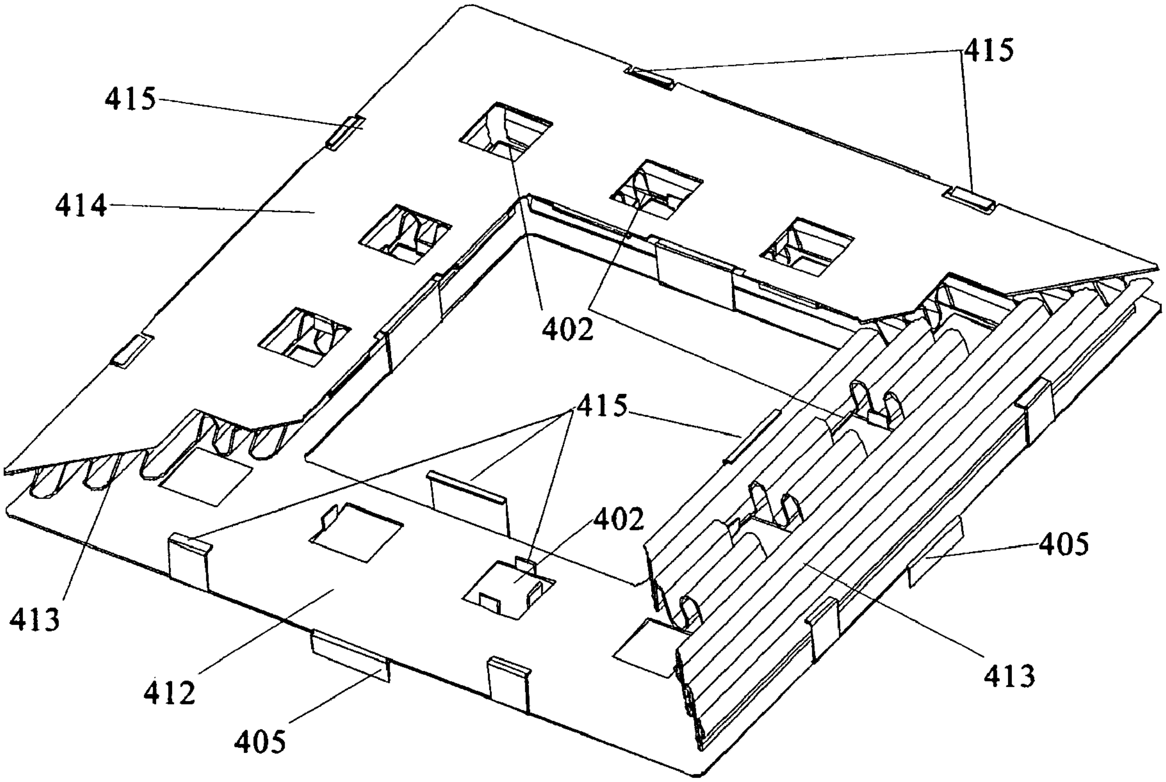

FIG. 8(*b*) shows the corresponding curves of force or pressure vs. displacement of a beam, spring, metal contact or a mechanical structure with respect to the stress-strain curves in FIG. 8(*a*). It is declared that the sockets 100 shown in FIG. 1, FIG. 2 and FIG. 3, the stiffeners 400 as shown in FIG. 6 are so called elasto-plastic because they are invented based on this Elasto-Plasticity thoery.

The elasto-plasticity application benefits two aspects: 1) the large elasto-plastic deformation; 2) and the bounded force or pressure of the structure. Herein FIG. 9 shows the cross section view of the subsystem assembly of FIG. 7. For example, every metal contact of the socket 100 has nearly the same strength (Force) when it comes to large deformation stage (point B' in FIG. 8(*b*), although the displacement A'B' may be different at different positions due to different tolerances and the bending deformation on the PCB and the bolster plate. This enables a precise design of nearly uniformed pressure transition ($P_{LGA}$ shown in FIG. 9) from package to the PCB by the metal contacts of the socket 110. Similarly, the elasto-plastic stiffener 400 with the same property is designed to a bounded pressure ($P_{STIFFENER}$ shown in FIG. 9) such that its total force is less than the total force of the socket ($P_{LGA}$ shown in FIG. 9). The pressure $P_{DIE}$ shown in FIG. 9 on the top of the semiconductor will balance the whole package. If the frame 220 is designed very close to the socket 10, the bending deformation of PCB side 226 and the top side heat sink 210 will be minimized. Although this low strength design ends up with smaller elastic deformation, it is sufficient to accommodate the tolerances of package thickness and bottom co-planary of the package 300 because all other tolerances such as PCB 226 and frame 220 have been absolved in the plastic deformation of the metal contact socket elasto-plastic socket. It is now concluded that the pressure on semiconductor can be well controled with the elasto-plastic stiffener to meet the mechanical requirement on very/ultra low K dielectric film in IC chips. Using the lidless flip chip package 300 with or without heat spreader, this assembly approach of FIG. 9 can dissipate heat at ultimate efficiency. It is also a solution of total low cost to end cutomers because of the savings of package lid and much simplified fixtures for the subsystem assembly.

Figure 10:
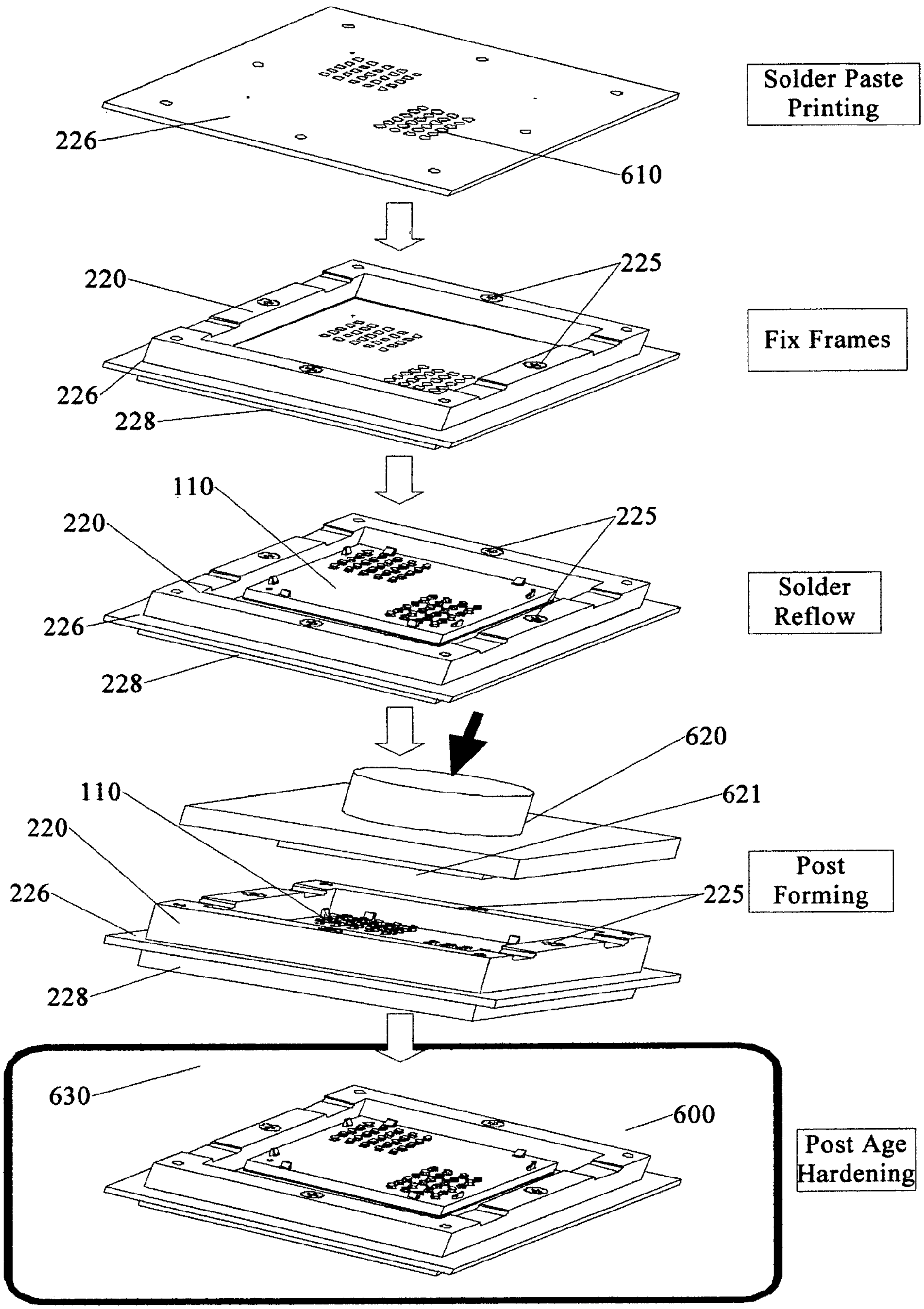
FIG. 10 is a flow chart of the fifth main embodiment of the operational processes that comprise the socket assembly, post forming and post age hardening.

To enhance the performance of the invention, FIG. 10 shows some optional processing steps briefly. After printing solder paste 610 on PCB 226, the bolster plate 228 and the frame 220 sandwich the PCB 226 by the screws 225 loose enough to allow the in-plane thermal expansion of PCB 226 during solder reflow process. The purpose of this step is to control the co-planarity of the socket 10 when it is mounted on the PCB 226 during solder reflow. This is an effective way to control the warpage of the socket and the PCB, especially for a relative large size socket or BGA package. If the elasto-plastic Land or Ball Grid Array sockets are used as testing sockets, the long fatigue life for many cycles are required. To gain very high fatigue life, the new concepts of Post-Forming and Post Age Hardening are proposed. A Post-Forming process is that a press 620 with a package profile 621 is used to apply pressure on the BGA/LGA socket 110 after solder reflow process. The force applied until the bottom of the lid 622 mates with the top of the frame is about the total force of the upper bound of all metal contacts because it will be loaded to plastic hardening stage. This is a short time process and it can be done in the assembly line. Through this process, all of tolerances due to PCB 226, socket 110 and frame 220 and etc. are eliminated by the plastic deformation of the metal contacts on the socket 110. In order to ensure the socket works in linear elastic range for all packages in the life time, the mechanical strength must be increased by Post Age Hardening or post Precipitation Hardening in oven 630 for the assembly 600 at a temperature lower than solder reflow condition for 2~5 hours. In this process, the parts are put in the high temperature bags which are vacuumed to prevent the gold plating of the metal contacts from oxidization, before they are put in high temperature for age hardening. The metal contacts will then behave as curve 504 and 504' in FIG. 8

What is claimed is:

1. An improved Land/Ball Grid Array (L/BGA) integrated circuit assembly, comprising:

a bolster plate;
a printed circuit board (PCB) above the bolster plate;
a L/BGA socket mounted on the PCB;
a L/BGA package mounted on and aligned with the L/BGA socket, the L/BGA package comprising:
a package substrate; and
a semiconductor chip mounted on the package substrate;
an elasto-plastic stiffener mounted on the package substrate of the L/BGA package, the elasto-plastic stiffener sharing a pressure with the semiconductor chip;
a frame mounted on the PCB and surrounding the L/BGA socket, the L/BGA package, and the elasto-plastic stiffener;
a heat transfer device mounted on the L/BGA package, the elasto-plastic stiffener, and the frame, wherein:
the assembly is secured with fasteners through the heat transfer device, the frame, the PCB, and the bolster plate so that a top surface of the L/BGA package have intimate contact with a bottom surface of the heat transfer device;
the elasto-plastic stiffener is plastically deformed under the elasto-plastic stiffener's portion of the pressure to conform the elasto-plastic stiffener to vertical variations of elements above and below the elasto-plastic stiffener; and
the plastic deformation of the elasto-plastic stiffener defines an upper bound for the elasto-plastic stiffener's portion of the pressure, which in turn defines the semiconductor chip's portion of the pressure.

2. The assembly of claim 1, wherein the L/BGA socket is an elasto-plastic socket comprising:
an insulative board defining a plurality of housing openings and a plurality of holes proximate to edges of the insulative board;
a plurality of metal contacts fitting in the housing openings on the insulative board, wherein:
the metal contacts plastically deform under another pressure to conform the metal contacts to vertical variations of elements above and below the elasto-plastic socket; and
the plastic deformation of the metal contacts uniformly distributes the another pressure;
a laminate bonding layer applied on the insulative board to fix the metal contacts; and
a plurality of alignment members fitting in the holes on the insulative board for aligning the L/BGA package to the metal contacts.

3. The assembly of claim 2, wherein the metal contacts each comprises a top surface portion for contacting a package pad, a curved plate spring portion of differing width connected to the top surface portion, a contact wall portion providing sliding contact with the curved plate spring portion and a PCB contact portion.

4. The assembly of claim 3, wherein the top surface portion has a concave spherical surface for contacting a BGA package.

5. The assembly of claim 3 or 4, further comprising a solder ball attached to the PCB contact portion for surface mount on the PCB.

6. The assembly of claim 2, wherein the alignment members are selected from the group consisting of pins or spring clips.

7. The assembly of claim 3, wherein the metal contacts are plated with gold and are stamped and formed from sheet metal.

8. The assembly of claim 7, wherein the sheet metal is selected from copper alloys including BeCu.

9. The assembly of claim 1, wherein the elasto-plastic stiffener comprises:
a top plate;
a bottom plate having retaining means for retaining positioning of the stiffener to the package substrate; and
a serpentine shaped supporting structure sandwiched between the top and the bottom plates, wherein the serpentine shaped supporting structure allows for large deformation in thickness of the stiffener while supporting a desired pressure.

10. The assembly of claim 9, wherein the stiffener is formed of a single piece or multiple pieces of sheet metal.

11. The assembly of claim 9, wherein the serpentine shaped support structure is a wave shaped structure perpendicular to the top and the bottom plates.

12. The assembly of claim 11, wherein the serpentine shaped support structure is slanted inward toward the semiconductor chip of the L/BGA package or slanted outward.

13. The assembly of claim 1, wherein the L/BGA package is selected from the group consisting of a lidded package with a small lid and a lidless package.

14. The assembly of claim 13, wherein the L/BGA package further comprises a thin layer of heat spreader having a very high in-plane or isotropic thermal conductivity adhered to a top side of the semiconductor chip, the heat spreader spreading heat from hot spots on the semiconductor chip.

15. The assembly of claim 1, wherein the fasteners are screws.

16. The assembly of claim 1, wherein the heat transfer device is a heat sink.

17. The assembly of claim 1, wherein the subsystem is further secured with additional fasteners through the frame, the PCB, and the bolster plate.

* * * * *